United States Patent
Tai et al.

(10) Patent No.: US 10,810,411 B2
(45) Date of Patent: Oct. 20, 2020

(54) GESTURE RECOGNITION METHOD FOR REDUCING FALSE ALARM RATE, GESTURE RECOGNITION SYSTEM FOR REDUCING FALSE ALARM RATE, AND PERFORMING DEVICE THEREOF

(71) Applicant: KaiKuTek Inc., Taipei (TW)

(72) Inventors: Tsung-Ming Tai, New Taipei (TW); Yun-Jie Jhang, Taoyuan (TW); Wen-Jyi Hwang, Taipei (TW); Chun-Hsuan Kuo, San Diego, CA (US)

(73) Assignee: KAIKUTEK INC., Taipei (TW)

( * ) Notice: Subject to any disclaimer, the term of this patent is extended or adjusted under 35 U.S.C. 154(b) by 253 days.

(21) Appl. No.: 16/103,215

(22) Filed: Aug. 14, 2018

(65) Prior Publication Data
US 2019/0244016 A1    Aug. 8, 2019

Related U.S. Application Data

(60) Provisional application No. 62/626,147, filed on Feb. 4, 2018.

(51) Int. Cl.
*G06K 9/62* (2006.01)
*G01S 13/89* (2006.01)
(Continued)

(52) U.S. Cl.
CPC .......... *G06K 9/00335* (2013.01); *G01S 7/414* (2013.01); *G01S 7/417* (2013.01);
(Continued)

(58) Field of Classification Search
CPC ............. G06K 9/00335; G06K 9/2018; G06K 9/4628; G06K 9/6215; G06K 9/6256;
(Continued)

(56) References Cited

U.S. PATENT DOCUMENTS 8,873,841 B2 * 10/2014 Yang ..................... G06F 3/0346
382/159
9,971,414 B2 * 5/2018 Gollakota ............... G06F 13/28
(Continued)

FOREIGN PATENT DOCUMENTS

EP         3203412 A1 *  8/2017 ........... G06K 9/4628
WO   WO-2004027685 A2 *  4/2004 ......... G06K 9/00335
(Continued)

*Primary Examiner* — Timothy A Brainard
*Assistant Examiner* — Nuzhat Pervin
(74) *Attorney, Agent, or Firm* — WPAT, PC

(57) ABSTRACT

A performing device of a gesture recognition system for reducing a false alarm rate executes a performing procedure of a gesture recognition method for reducing the false alarm rate. The gesture recognition system includes two neural networks. A first recognition neural network is used to classify a gesture event, and a first noise neural network is used to determine whether the sensing signal is the noise. Since the first noise neural network can determine whether the sensing signal is the noise, the gesture event may not be executed when the sensing signal is the noise. Therefore, the false alarm rate may be reduced.

11 Claims, 4 Drawing Sheets

(51) Int. Cl.

| | |
|---|---|
| *G01S 7/41* | (2006.01) |
| *G01S 13/58* | (2006.01) |
| *G06T 7/20* | (2017.01) |
| *G01S 13/50* | (2006.01) |
| *G01S 7/35* | (2006.01) |
| *G06K 9/00* | (2006.01) |
| *G06K 9/20* | (2006.01) |
| *G06K 9/46* | (2006.01) |
| *G06N 20/00* | (2019.01) |
| *G06F 3/01* | (2006.01) |
| *G06F 9/50* | (2006.01) |
| *G06N 3/08* | (2006.01) |
| *H03B 21/02* | (2006.01) |
| *G06F 17/18* | (2006.01) |

(52) U.S. Cl.
CPC ............ *G01S 13/584* (2013.01); *G01S 13/89* (2013.01); *G06F 3/017* (2013.01); *G06F 9/5027* (2013.01); *G06F 17/18* (2013.01); *G06K 9/2018* (2013.01); *G06K 9/4628* (2013.01); *G06K 9/6215* (2013.01); *G06K 9/6256* (2013.01); *G06K 9/6259* (2013.01); *G06K 9/6262* (2013.01); *G06K 9/6267* (2013.01); *G06K 9/6271* (2013.01); *G06N 3/08* (2013.01); *G06N 20/00* (2019.01); *G06T 7/20* (2013.01); *H03B 21/02* (2013.01); *G01S 7/415* (2013.01); *G01S 13/50* (2013.01); *G01S 2007/356* (2013.01); *G06T 2207/10028* (2013.01); *G06T 2207/20056* (2013.01); *G06T 2207/20081* (2013.01); *G06T 2207/20084* (2013.01)

(58) Field of Classification Search
CPC .. G06K 9/6259; G06K 9/6262; G06K 9/6267; G06K 9/6271; G06N 20/00; G06N 3/08; G01S 7/414; G01S 7/417; G01S 13/584; G01S 13/89; G01S 7/415; G01S 13/50; G01S 2007/356; G06F 3/017; G06F 9/5027; G06F 17/18; G06T 7/20; G06T 2207/10028; G06T 2207/20056; G06T 2207/20081; G06T 2207/20084; H03B 21/02

USPC .......................................................... 342/109
See application file for complete search history.

(56) References Cited

U.S. PATENT DOCUMENTS

| | | | | |
|---|---|---|---|---|
| 9,993,166 | B1* | 6/2018 | Johnson | A61B 5/0022 |
| 10,004,451 | B1* | 6/2018 | Proud | A61M 21/02 |
| 10,058,290 | B1* | 8/2018 | Proud | G16H 40/67 |
| 10,228,801 | B2* | 3/2019 | Robucci | G06F 3/0346 |
| 10,515,623 | B1* | 12/2019 | Grizzel | H04M 1/6066 |
| 2004/0056907 | A1* | 3/2004 | Sharma | G06K 9/00335 |
| | | | | 715/863 |
| 2009/0265671 | A1* | 10/2009 | Sachs | G06F 3/0346 |
| | | | | 715/863 |
| 2012/0272194 | A1* | 10/2012 | Yang | G06F 3/0346 |
| | | | | 715/863 |
| 2012/0323521 | A1* | 12/2012 | De Foras | G06F 3/0346 |
| | | | | 702/141 |
| 2015/0199045 | A1* | 7/2015 | Robucci | H03K 17/9622 |
| | | | | 345/174 |
| 2015/0254575 | A1* | 9/2015 | Nere | G06N 20/00 |
| | | | | 706/12 |
| 2016/0213308 | A1* | 7/2016 | Proud | G06F 3/017 |
| 2017/0060254 | A1* | 3/2017 | Molchanov | G06N 3/0454 |
| 2017/0124447 | A1* | 5/2017 | Chang | G06F 16/3334 |
| 2020/0017117 | A1* | 1/2020 | Milton | B60W 50/02 |

FOREIGN PATENT DOCUMENTS

| | | | | |
|---|---|---|---|---|
| WO | WO-2012143603 A2 * | 10/2012 | ............ | G06K 9/70 |
| WO | WO-2015134908 A1 * | 9/2015 | ............ | G06N 20/00 |
| WO | WO-2017134059 A1 * | 8/2017 | ......... | G06K 9/00355 |

* cited by examiner

GESTURE RECOGNITION METHOD FOR REDUCING FALSE ALARM RATE, GESTURE RECOGNITION SYSTEM FOR REDUCING FALSE ALARM RATE, AND PERFORMING DEVICE THEREOF

BACKGROUND OF THE INVENTION

1. Field of the Invention

The present invention relates to a recognition method and a recognition system, and more particularly to a gesture recognition method, a gesture recognition system for reducing a false alarm rate, and a performing device thereof.

2. Description of the Related Art

Recognition systems generally receive sensing signals from a sensor to recognize a motion of the user. For example, the sensor senses the motion of the user to generate the sensing signals. The recognition system receives sensing signals from the sensor, and the recognition system processes the sensing signals. The recognition system further implements a recognition method to determine whether a user being observed by the sensor is using portions of his or her body to make particular actions or form particular shapes or gestures. The recognition system classifies the motion of the user, and associates the motion of the user with executable commands or instructions.

However, when noise influences the sensor, the sensor may generate the sensing signals in response to the noise. In this situation, a false alarm occurs.

Namely, when the user does not do any motion, the sensor may still generate the sensing signals in response to the noise, and the recognition system may execute the commands. The false alarm may influence confidence of the user in trusting the recognition systems.

Therefore, the recognition system needs to be further improved.

SUMMARY OF THE INVENTION

An objective of the present invention is to provide a gesture recognition method for reducing a false alarm rate, a gesture recognition system for reducing the false alarm rate, and a performing device thereof. The present invention further determines whether a sensing signal is a noise by using a first noise neural network. Therefore, the false alarm rate can be reduced.

The gesture recognition method for reducing the false alarm rate includes the performing procedure, and the performing procedure includes steps of:
  receiving a sensing signal from a sensing unit;
  setting the sensing signal to input data of a first recognition neural network;
  classifying a gesture event according to the sensing signal by using the first recognition neural network;
  setting the sensing signal to input data of a first noise neural network;
  determining whether the sensing signal is a noise by using the first noise neural network;
  when the sensing signal is not the noise, executing the gesture event.

Further, the gesture recognition system for reducing the false alarm rate includes a performing device. The performing device includes a sensing unit, a memory unit, and a processing unit.

The sensing unit senses a training signal. The memory unit stores a first recognition neural network and a first noise neural network.

The processing unit is electrically connected to the sensing unit and the memory unit. The processing unit receives the sensing signal from the sensing unit, sets the sensing signal to input data of the first recognition neural network, and classifies a gesture event according to the sensing signal by using the first recognition neural network.

The processing unit further sets the sensing signal to input data of the first noise neural network, and the processing unit determines whether the sensing signal is a noise by using the first noise neural network. When the sensing signal is not the noise, the processing unit executes the gesture event.

The present invention includes two neural networks. The first recognition neural network is used to classify the gesture event, and the first noise neural network is used to determine whether the sensing signal is the noise.

The first noise neural network can determine whether the sensing signal is the noise, and the gesture event may not be executed when the sensing signal is the noise. Therefore, the false alarm rate may be reduced, and the confidence of the user in trusting the gesture recognition system can be increased.

DETAILED DESCRIPTION OF THE INVENTION

Figure 1:
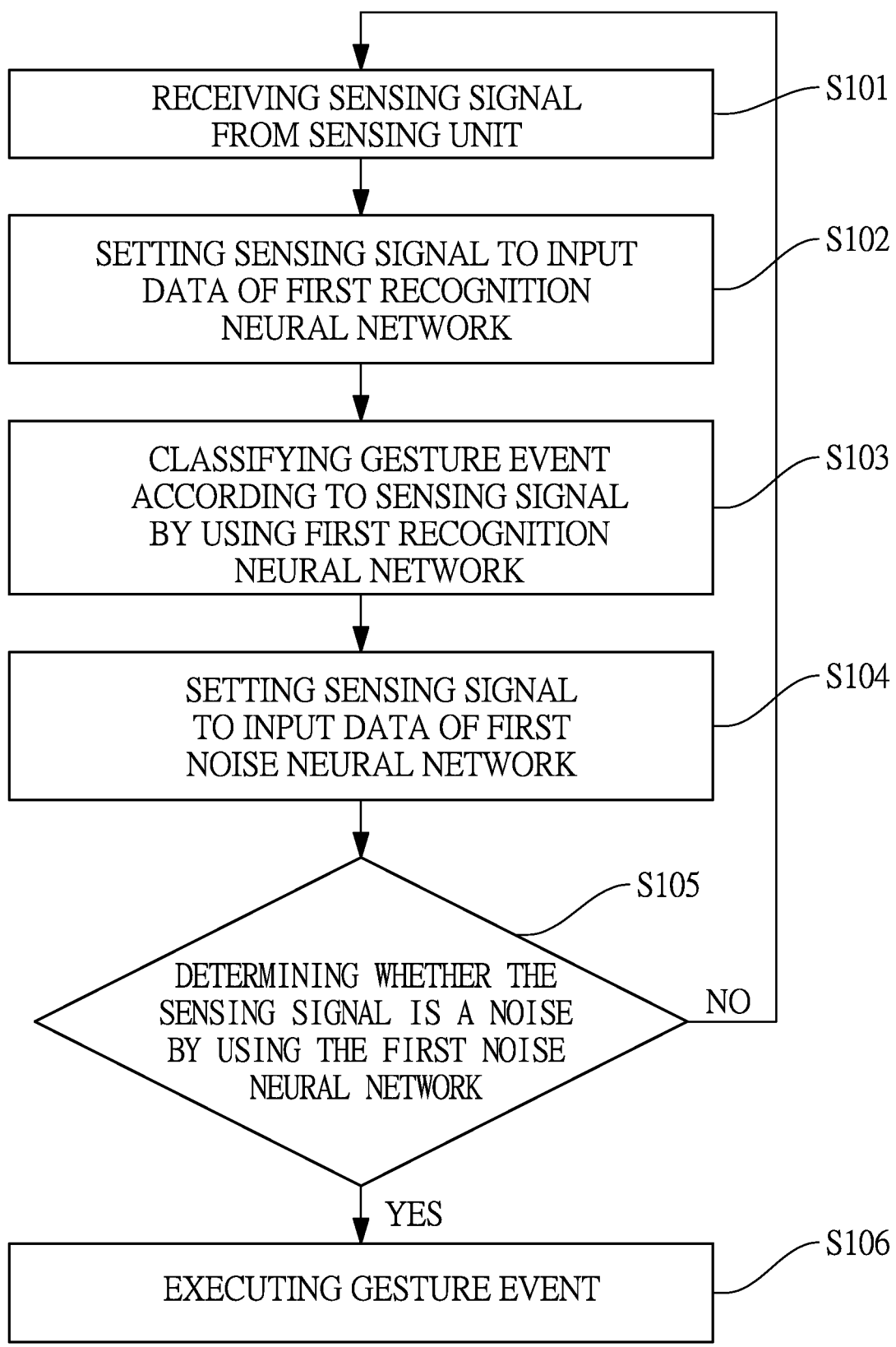
FIG. 1 is a flowchart of a performing procedure of a gesture recognition method for reducing a false alarm rate of the present invention.

With reference to FIG. 1, the present invention relates to a gesture recognition method for reducing a false alarm rate and a gesture recognition system for reducing the false alarm rate. The gesture recognition method for reducing the false alarm rate includes a performing procedure, and the performing procedure includes steps of:
  receiving a sensing signal from a sensing unit (S101);
  setting the sensing signal to input data of a first recognition neural network (S102);
  classifying a gesture event according to the sensing signal by using the first recognition neural network (S103);
  setting the sensing signal to input data of a first noise neural network (S104);
  determining whether the sensing signal is a noise by using the first noise neural network (S105);
  when the sensing signal is not the noise, executing the gesture event (S106).

Figure 2:
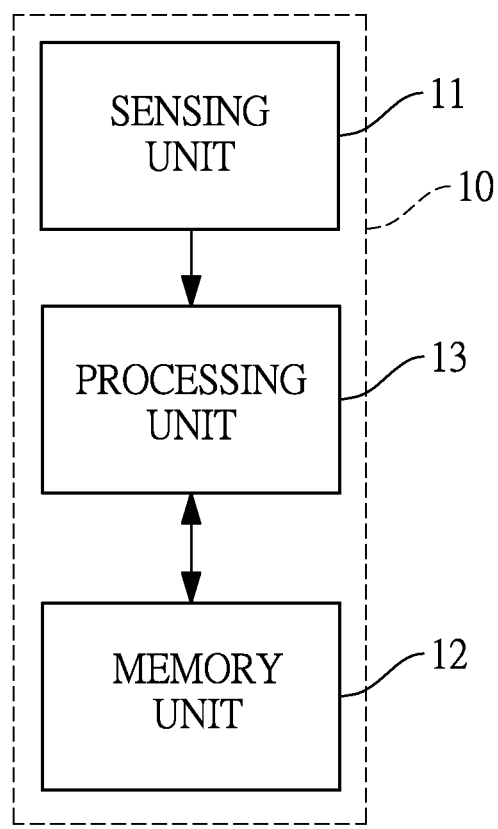
FIG. 2 is a block diagram of a gesture recognition system for reducing the false alarm rate of the present invention.

With reference to FIG. 2, the gesture recognition system for reducing the false alarm rate can execute the gesture recognition method, and the gesture recognition system includes a performing device 10. The performing device 10 includes a sensing unit 11, a memory unit 12, and a processing unit 13.

The sensing unit 11 senses a sensing signal. The memory unit 12 stores a first recognition neural network and a first noise neural network.

The processing unit 13 is electrically connected to the sensing unit 11 and the memory unit 12. The processing unit 13 receives the sensing signal from the sensing unit 11, sets the sensing signal to input data of the first recognition neural network, and classifies a gesture event according to the sensing signal by using the first recognition neural network.

The processing unit 13 further sets the sensing signal to input data of the first noise neural network, and the processing unit 13 determines whether the sensing signal is a noise by using the first noise neural network. When the sensing signal is not the noise, the processing unit 13 executes the gesture event.

The present invention uses concurrent neural network architectures. The concurrent neural network architectures include two neural networks. One of the two neural networks is the first recognition neural network which is used to classify the gesture event, and the other one of the two neural networks is the first noise neural network which is used to determine whether the sensing signal is the noise.

The first noise neural network can determine whether the sensing signal is the noise, and the gesture event may not be executed when the sensing signal is the noise. Therefore, the false alarm rate may be reduced.

0 in the result of the first noise neural network represents that the sensing signal is not the noise. 1 in the result of the first noise neural network represents that the sensing signal is the noise.

0 in the result of the first recognition neural network represents that the sensing signal is not the gesture event. 1 in the result of the first recognition neural network represents that the sensing signal is a first gesture event. 2 in the result of the first recognition neural network represents that the sensing signal is a second gesture event.

When a user does not do any motion, the first recognition neural network may still classify the gesture event according to the sensing signal. For example, the result of the first noise neural network is 0, and the result of the first recognition neural network is 1 or 2.

However, the present invention further uses the first noise neural network to determine whether the sensing signal is the noise, and the gesture event may not be executed when the sensing signal is the noise. Namely, the gesture event may not be executed when the user does not do any motion. Therefore, the false alarm rate may be reduced, and the confidence of the user in trusting the gesture recognition system can be increased.

When the first noise neural network determines that the sensing signal is not the noise, the gesture event can be executed. For example, the result of the first noise neural network is 1, and the result of the first recognition neural network is 1.

Further, the performing procedure further comprises steps of:

when the sensing signal is the noise, receiving another sensing signal from the sensing unit again (S101).

Namely, when the first noise neural network determines that the sensing signal is the noise, the processing unit 13 receives another sensing signal from the sensing unit 11.

In the embodiment, the first recognition neural network is a convolutional neural network (CNN) or a Long Short Memory (LSTM) network, the first noise neural network is a fully-connected neural network, and the sensing signal is a Range Doppler Image (RDI) signal. Further, the sensing unit 11 is a Doppler radar.

Figure 4:
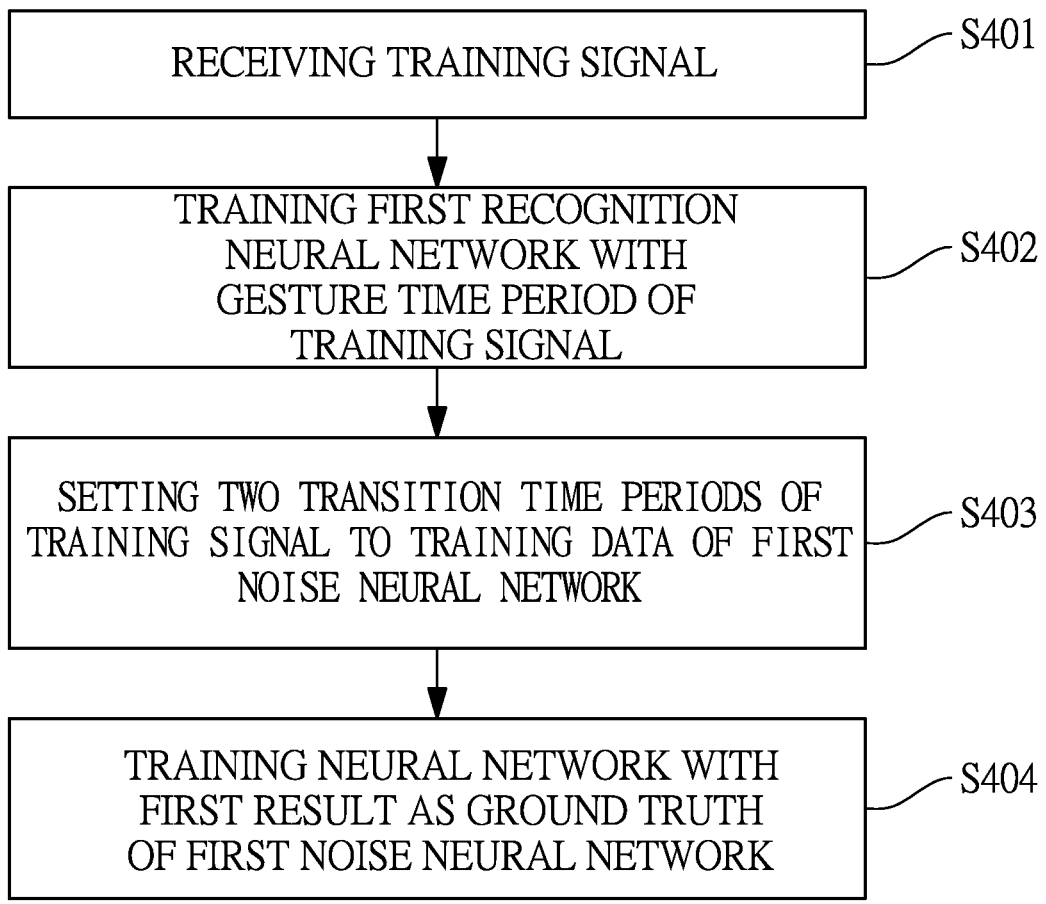
FIG. 4 is a flowchart of a training procedure of a gesture recognition method for reducing a false alarm rate of the present invention.

With reference to FIG. 4, the gesture recognition method for reducing the false alarm rate further includes a training procedure. The training procedure includes steps of:

receiving a training signal (S401); wherein the training signal comprises a gesture time period and two transition time periods, and the gesture time period is between the two transition time periods in time series;

training the first recognition neural network with the gesture time period of the training signal (S402);

setting the two transition time periods of the training signal to training data of the first noise neural network (S403), and training the neural network with a first result as ground truth of the first noise neural network (S404); wherein when a result of the first noise neural network is the first result, the first noise neural network determines that the sensing signal is the noise.

Figure 5:
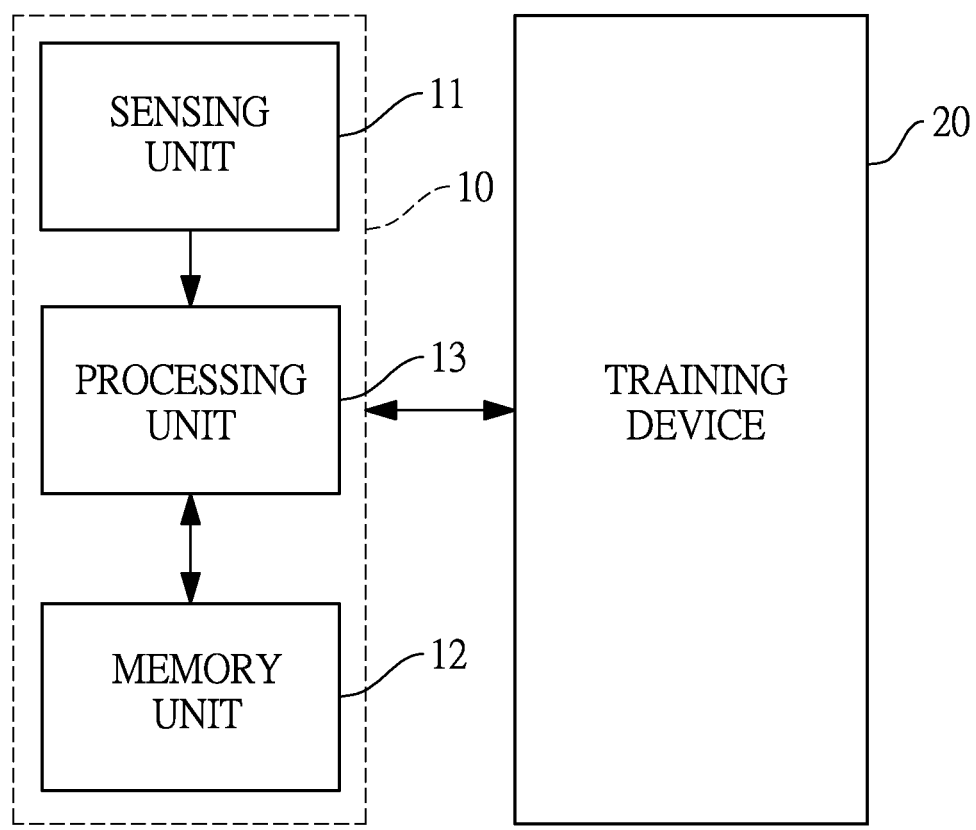
FIG. 5 is a block diagram of a gesture recognition system for reducing the false alarm rate of the present invention.

With reference to FIG. 5, the gesture recognition system for reducing the false alarm rate further includes a training device 20. The training device 20 stores a second recognition neural network and a second noise neural network, and the training device 20 is connected to the performing device 10 to receive a training signal from the sensing unit 11.

The training signal comprises a gesture time period and two transition time periods, and the gesture time period is between the two transition time periods in time series.

The training device 20 trains the second recognition neural network with the gesture time period of the training signal. The training device 20 further sets the two transition time periods of the training signal to training data of the first noise neural network, and trains the second neural network with a first result as ground truth of the first noise neural network.

When a result of the second noise neural network is the first result, the second noise neural network determines that the sensing signal is the noise.

The training device 20 further updates the first recognition neural network of the performing device according to the second recognition neural network, and updates the first noise neural network of the performing device according to the second noise neural network.

The present invention trains the second noise neural network by using the transition time periods of the training signal. Namely, the second noise neural network is not trained by using open data. Further, since the second noise neural network is trained by using the transition time periods of the training signal, a transition between two gesture events can also be easily determined to be the noise by using the second noise neural network. Therefore, impact of the noise can be alleviated by using a simple training process without using open data.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A gesture recognition method for reducing a false alarm rate, comprising a performing procedure and a training procedure;

wherein the performing procedure comprises steps of:
receiving a sensing signal from a sensing unit;
setting the sensing signal to input data of a first recognition neural network;
classifying a gesture event according to the sensing signal by using the first recognition neural network;

setting the sensing signal to input data of a first noise neural network;

determining whether the sensing signal is a noise by using the first noise neural network;

when the sensing signal is not the noise, executing the gesture event;

wherein the training procedure comprises steps of:

receiving a training signal; wherein the training signal comprises a gesture time period and two transition time periods, and the gesture time period is between the two transition time periods in time series;

training the first recognition neural network with the gesture time period of the training signal;

setting the two transition time periods of the training signal to training data of the first noise neural network, and training the first noise neural network with a first result as ground truth of the first noise neural network; wherein when a result of the first noise neural network is the first result, the first noise neural network determines that the sensing signal is the noise.

2. The gesture recognition method for reducing the false alarm rate as claimed in claim 1, wherein the performing procedure further comprises steps of:

when the first noise neural network determines that the sensing signal is the noise, receiving another sensing signal from the sensing unit again.

3. The gesture recognition method for reducing the false alarm rate as claimed in claim 1, wherein the first recognition neural network is a convolutional neural network (CNN) or a Long Short Memory (LSTM) network.

4. The gesture recognition method for reducing the false alarm rate as claimed in claim 1, wherein the first noise neural network is a fully-connected neural network.

5. The gesture recognition method for reducing the false alarm rate as claimed in claim 1, wherein the sensing signal is a Range Doppler Image (RDI) signal.

6. A gesture recognition system for reducing a false alarm rate, comprising a performing device and a training device;

wherein the performing device comprises:

a sensing unit, configured to sense a sensing signal;

a memory unit, configured to store a first recognition neural network and a first noise neural network;

a processing unit, configured to be electrically connected to the sensing unit and the memory unit; wherein the processing unit receives the sensing signal from the sensing unit, sets the sensing signal to input data of the first recognition neural network, and classifies a gesture event according to the sensing signal by using the first recognition neural network;

wherein the processing unit further sets the sensing signal to input data of the first noise neural network, and the processing unit determines whether the sensing signal is a noise by using the first noise neural network;

wherein when the sensing signal is not the noise, the processing unit executes the gesture event;

wherein the training device comprises:

wherein the training device stores a second recognition neural network and a second noise neural network, and the training device is connected to the performing device to receive a training signal from the sensing unit;

wherein the training signal comprises a gesture time period and two transition time periods, and the gesture time period is between the two transition time periods in time series;

wherein the training device trains the second recognition neural network with the gesture time period of the training signal;

wherein the training device sets the two transition time periods of the training signal to training data of the first noise neural network, and trains the second neural network with a first result as ground truth of the first noise neural network;

wherein when a result of the second noise neural network is the first result, the second noise neural network determines that the sensing signal is the noise;

wherein the training device further updates the first recognition neural network of the performing device according to the second recognition neural network, and updates the first noise neural network of the performing device according to the second noise neural network.

7. The gesture recognition system for reducing the false alarm rate as claimed in claim 6, wherein when the first noise neural network determines that the sensing signal is the noise, the processing unit receives another sensing signal from the sensing unit.

8. The gesture recognition system for reducing the false alarm rate as claimed in claim 6, wherein the first recognition neural network is a convolutional neural network (CNN) or a Long Short Memory (LSTM) network.

9. The gesture recognition system for reducing the false alarm rate as claimed in claim 6, wherein the first noise neural network is a fully-connected neural network.

10. The gesture recognition system for reducing the false alarm rate as claimed in claim 6, wherein the sensing signal is a Range Doppler Image (RDI) signal.

11. The gesture recognition system for reducing the false alarm rate as claimed in claim 6, wherein the sensing unit is a Doppler radar.

* * * * *